United States Patent
Tanno et al.

(10) Patent No.: US 12,136,907 B2
(45) Date of Patent: Nov. 5, 2024

(54) COMPOSITE SUBSTRATE FOR SURFACE ACOUSTIC WAVE DEVICE AND MANUFACTURING METHOD THEREOF

(71) Applicant: Shin-Etsu Chemical Co., Ltd., Tokyo (JP)

(72) Inventors: Masayuki Tanno, Gunma (JP); Shoji Akiyama, Gunma (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 706 days.

(21) Appl. No.: 17/308,422

(22) Filed: May 5, 2021

(65) Prior Publication Data
US 2021/0359660 A1 Nov. 18, 2021

(30) Foreign Application Priority Data
May 15, 2020 (JP) .................. 2020-086299

(51) Int. Cl.
*H03H 9/02* (2006.01)
*H03H 3/08* (2006.01)
(Continued)

(52) U.S. Cl.
CPC .......... *H03H 9/02551* (2013.01); *H03H 3/08* (2013.01); *H03H 9/02574* (2013.01);
(Continued)

(58) Field of Classification Search
CPC ........... H03H 9/02551; H03H 9/02574; H10N 30/10513
(Continued)

(56) References Cited

U.S. PATENT DOCUMENTS

| 2013/0285768 A1 | 10/2013 | Watanabe et al. |
| 2014/0203893 A1 | 7/2014 | Kando et al. |

(Continued)

FOREIGN PATENT DOCUMENTS

| JP | 5713025 | 5/2015 |
| JP | 5861789 | 2/2016 |

(Continued)

OTHER PUBLICATIONS

Official Communication Received in European Patent Application No. 21173392.8, dated Oct. 14, 2021.

(Continued)

*Primary Examiner* — Derek J Rosenau
(74) *Attorney, Agent, or Firm* — GREENBLUM & BERNSTEIN, P.L.C.

(57) ABSTRACT

A piezoelectric composite substrate for SAW devices with small loss is provided. A composite substrate for a surface acoustic wave device according to one embodiment of the present invention has a piezoelectric single crystal thin film, a support substrate, and a first intervening layer between the piezoelectric single crystal thin film and the support substrate. In said composite substrate, the first intervening layer is in contact with the piezoelectric single crystal thin film, and the acoustic velocity of the transverse wave in the first intervening layer is faster than the acoustic velocity of the fast transverse wave in the piezoelectric single crystal thin film.

16 Claims, 6 Drawing Sheets

(51) Int. Cl.
  *H03H 9/64* (2006.01)
  *H10N 30/00* (2023.01)
  *H10N 30/072* (2023.01)

(52) U.S. Cl.
  CPC ........ *H03H 9/6483* (2013.01); *H10N 30/072* (2023.02); *H10N 30/706* (2024.05)

(58) Field of Classification Search
  USPC ...... 310/313 R, 313 A, 313 B, 313 C, 313 D
  See application file for complete search history.

(56) References Cited

U.S. PATENT DOCUMENTS

| | | | |
|---|---|---|---|
| 2015/0028720 A1* | 1/2015 | Kando | H03H 9/02559 156/230 |
| 2015/0069882 A1* | 3/2015 | Umeda | H03H 9/02574 310/313 B |
| 2019/0245510 A1 | 8/2019 | Mimura | |
| 2019/0288661 A1 | 9/2019 | Akiyama et al. | |
| 2019/0379347 A1 | 12/2019 | Goto et al. | |
| 2021/0083644 A1 | 3/2021 | Ito et al. | |
| 2021/0194457 A1* | 6/2021 | Nagatomo | H03H 9/14541 |

FOREIGN PATENT DOCUMENTS

| | | |
|---|---|---|
| JP | 6250856 | 12/2017 |
| WO | 2019/022236 | 1/2019 |
| WO | 2020/059765 | 3/2020 |

OTHER PUBLICATIONS

Official Communication Received in Japan Patent Application No. 2020-086299, dated Jun. 20, 2023.
"Temperature Compensation Technology used for SAW-Duplexer used in RF Front End of Smartphone", Dempa Shimbum High Technology, Nov. 8, 2012, pp. 1-4, with partial translation.
H. Kobayashi et al., "A Study on Temperature-Compensated Hybrid Substrates for Surface Acoustics Wave Filters", IEEE International Ultrasonic Symposium Proceedings, 2010, pp. 637-640.
Official Communication Received in European Patent Application No. 21173392.8, dated Aug. 2, 2024.

* cited by examiner

COMPOSITE SUBSTRATE FOR SURFACE ACOUSTIC WAVE DEVICE AND MANUFACTURING METHOD THEREOF

CROSS-REFERENCE TO RELATED APPLICATION

This non-provisional application claims priority under 35 U.S.C. § 119(a) from Japanese Patent Application No. 2020-086299, filed on May 15, 2020, the entire contents of which are incorporated herein by reference.

BACKGROUND

Technical Field

The present invention relates to a composite substrate for a surface acoustic wave device in which a piezoelectric single crystal substrate and a supporting substrate are bonded, a method for manufacturing the same.

Background Art

In recent years, in the market of mobile communications typified by smartphones, data traffic has been rapidly increased. To cope with this, it is necessary to increase the number of communication bands, and it is indispensable to miniaturize various devices such as surface acoustic wave devices and to achieve high performance of the devices.

Piezoelectric materials such as lithium tantalate (LT) and lithium niobate (LN) are widely used as materials for surface acoustic wave (SAW) devices (e.g., surface acoustic wave filters). Although these materials have a large electromechanical coupling coefficient and the bandwidth of the devices can be broadened, there is a problem that the temperature stability of the materials is low, and so the adaptable frequency is shifted by the temperature change. This is because lithium tantalate or lithium niobate has a very high thermal expansion coefficient.

In order to solve the problem, there has been proposed a composite substrate obtained by bonding a material having a small thermal expansion coefficient to lithium tantalate or lithium niobate and thinning a side of the piezoelectric material to a thickness of several μm to several tens μm. In this composite substrate, the thermal expansion of the piezoelectric material is suppressed by bonding the material having a small thermal expansion coefficient such as sapphire or silicon, and thereby, the temperature characteristics are improved (Non-Patent Documents 1 and 2). Further, Patent Document 1 discloses an acoustic wave device having a piezoelectric film. This acoustic wave device includes a supporting substrate, a high acoustic velocity film formed on the supporting substrate and having a higher bulk acoustic velocity than the acoustic velocity propagating through the piezoelectric film, a low acoustic velocity film stacked on the high acoustic velocity film and having a slower bulk acoustic velocity than the bulk acoustic velocity propagating through the piezoelectric film, the piezoelectric film stacked on the low acoustic velocity film, and an IDT electrode formed on one surface of the piezoelectric film.

Further, Patent Document 2 discloses an acoustic wave device including a supporting substrate, a medium layer stacked on the supporting substrate, a piezoelectric body stacked on the medium layer for propagating a bulk wave, and an IDT electrode formed on one surface of the piezoelectric body. In this device, the medium layer includes a low-velocity medium in which the propagation velocity of the bulk wave, which is the main component of an acoustic wave, is slower than the acoustic velocity of the acoustic wave propagating in the piezoelectric body, and a high-velocity medium in which the propagation velocity of the bulk wave, which is the main component of the acoustic wave, is a faster than the acoustic velocity of the acoustic wave propagating in the piezoelectric body. When the acoustic velocity of the main vibration mode when the medium layer is formed of the high-velocity medium is VH and the acoustic velocity of the main vibration mode when the medium layer is formed of the low-velocity medium is VL, the medium layer is formed such that the acoustic velocity of the main vibration mode in the acoustic wave device having the medium layer is VL<the acoustic velocity of the main vibration mode<VH, and the thickness of the medium layer is 1λ or more when the period of the IDT is λ.

Further, Patent Document 3 discloses a composite substrate for a surface acoustic wave device including a piezoelectric single crystal thin film and a supporting substrate. In this device, at the bonding interface between the piezoelectric single crystal substrate and the supporting substrate, at least one of the piezoelectric single crystal thin film and the supporting substrate have an uneven structure, and the ratio of the average length RSm of the element in the sectional curve of the uneven structure and the wavelength λ of the surface acoustic wave when used as a surface acoustic wave device is 0.2 or more and 7.0 or less.

PRIOR ART REFERENCES

Patent Documents

Patent Document 1: Japanese Patent No. 5713025
Patent Document 2: Japanese Patent No. 5861789
Patent Document 3: Japanese Patent No. 6250856

Non-Patent Documents

Non-Patent Document 1: Temperature Compensation Technology for SAW-Duplexer Used in RF Front End of Smartphone, Dempa Shimbun High Technology, Nov. 8, 2012

Non Patent Document 2: A study on Temperature-Compensated Hybrid Substrates for Surface Acoustic Wave Filters", 2010 IEEE International Ultrasonic Symposium Proceedings, page 637-640.

SUMMARY OF THE INVENTION

Problems to be Solved by the Invention

However, when the surface acoustic wave filter is fabricated using the composite substrate of Patent Document 1 or Patent Document 2, there is a problem that noise called spurious or ripple is generated within the passband of the surface acoustic wave filter or at higher frequencies because the energy of the elastic wave leaks out from the piezoelectric material to the low-velocity medium. This noise occurs due to reflection at the bonding interface between the piezoelectric crystal film and the supporting substrate, and trapping of elastic waves in the intervening layer between the piezoelectric crystal film and the supporting substrate. This noise is not preferable because it deteriorates the frequency characteristics of the surface acoustic wave filter and causes an increase in loss.

In the composite substrate for surface acoustic wave devices described in Patent Document 3, either the piezoelectric single crystal thin film or the support substrate has an uneven structure, which is desirable because the uneven structure scatters unwanted waves, thereby suppressing the effects of reflected waves.

However, the inventor has carefully examined the possibility that the resistivity of the single-crystal piezoelectric film increases and its pyroelectricity increases as it goes through the wafer process of producing the composite substrate for surface acoustic wave devices described in Patent Document 3 and the heat treatment of the device process using this composite substrate. The reason for this was found to be that temperature changes during the process caused electric fields exceeding the coercive electric field to be generated in the concave and convex areas of the piezoelectric single crystal of the composite substrate, which in extreme cases caused problems with the polarization of the single crystal piezoelectric film being disturbed.

In view of the above, it is an object of the present invention to provide a piezoelectric composite substrate for SAW devices with small loss.

Means for Solving the Problems

A composite substrate for a surface acoustic wave device according to one embodiment of the present invention has a piezoelectric single crystal thin film, a support substrate, and a first intervening layer between the piezoelectric single crystal thin film and the support substrate. In said composite substrate, the first intervening layer is in contact with the piezoelectric single crystal thin film, and the acoustic velocity of the transverse wave in the first intervening layer is faster than the acoustic velocity of the fast transverse wave in the piezoelectric single crystal thin film. It is preferable that the volume resistivity of the composite substrate should be $1 \times 10^{12}$ Ω·cm or less.

The present invention will be explained using the case where the piezoelectric single crystal thin film is $LiTaO_3$ (LT) as an example. An intervening layer is provided between the LT, which is a piezoelectric single crystal thin film, and the support substrate. If the velocity of the bulk wave (transverse wave) of the intervening layer is slower than the bulk wave (fast transverse wave) of LT, the elastic wave is easily trapped in the intervening layer. Therefore, if the acoustic velocity of the transverse wave of the intervening layer is made to be faster than the acoustic velocity of the slow transverse wave of the piezoelectric single crystal thin film in the composite substrate, it is possible to improve the loss in the passband of the surface acoustic wave filter obtained using such a composite substrate 1. Hereinafter, the details will be described.

In the surface acoustic wave filter obtained by forming a periodic electrode structure on the composite substrate, for example, in the composite substrate in which a 46° rotated Y-cut LT and Si are joined and the LT thickness is 1 wavelength or more and the LT thickness excluding the singular point of the dispersion curve, the acoustic velocity of the main mode of the surface acoustic wave is 4060 m/s (the slowness which is the inverse of the acoustic velocity is $2.46 \times 10^{-3}$ s/m) when the electrode is electrically open, and is 3910 m/s (the slowness which is the inverse of the acoustic velocity is $2.56 \times 10^{-3}$ s/m) when the electrode is electrically short-circuited.

Therefore, the surface acoustic wave (or leaky wave or SH wave) propagating along the LT surface from the electrodes can be coupled with a particular bulk wave in the LT capable of propagating inside the LT substrate. That is, as shown in the slowness surface (calculated value) of the 46° rotated Y-cut LT shown in FIG. 1, the main mode of the composite substrate structure in which the above-mentioned 46° rotated Y-cut LT and Si are bonded explained above can be coupled with a bulk wave (slow transverse wave) capable of phase matching propagating about 22 degrees in the depth direction from the X-axis.

FIG. 2 shows an example of the slowness surface when the 46° rotated Y-cut LT is used as the piezoelectric single crystal thin film, and $Si_3N_4$ is used as the intervening layer. When $Si_3N_4$ is used as the intervening layer, the acoustic velocity of the transverse wave of the intervening layer can be made faster than the acoustic velocity of the fast transverse wave of the piezoelectric single crystal thin film.

In a situation where the acoustic velocity of the slow transverse wave of the intervening layer is faster than the acoustic velocity of the slow transverse wave of the piezoelectric single crystal thin film as shown in FIG. 2, the slow transverse wave emitted in the direction of about 22° from the X-axis of the 46° rotated Y-cut LT is totally reflected by the intervening layer even when reaching the intervening layer. Therefore, the bulk wave leaking inward from the surface acoustic wave (or leaky wave or SH wave) propagating along the LT surface from the electrodes is totally reflected by the intervening layer and cannot stay in the intervening layer.

As a result, there is no spurious that remains in the intervening layer around the main mode frequency. Accordingly, degradation of characteristics such as ripple and loss in the passband of the filter can be prevented.

Furthermore, in one embodiment of the invention, the first intervening layer is characterized by a high acoustic velocity and a water vapor transmission rate of $10^{-3}$ (g/m²/day) or less. This suppresses oxygen diffusion from the support substrate side of the intervening layer to the piezoelectric single crystal thin film side, which in turn suppresses the increase in pyroelectricity in the piezoelectric single crystal thin film of the composite substrate and the generation of an electric field when the composite substrate is heat-treated. Here, the water vapor transmission rate is the value measured by the Mocon method at a temperature of 40° C. and relative humidity of 90%.

The material of the first inclusion layer may be silicon oxynitride, silicon nitride, amorphous aluminum nitride, or aluminum oxide.

In the present invention, the composite substrate may have at least a first and a second intervening layer between the piezoelectric single crystal thin film and the support substrate. Here, the first intervening layer may be in contact with the piezoelectric single crystal thin film. It is preferable that the acoustic velocity of the transverse wave in the first intervening layer is faster than the acoustic velocity of the fast transverse wave in the piezoelectric single crystal thin film, and that the acoustic velocity of the transverse wave in the second intervening layer is slower than the acoustic velocity of the fast transverse wave in the piezoelectric single crystal thin film.

In the present invention, the second intervening layer may contain oxygen. The second intervening layer may contain any of silicon dioxide, titanium dioxide, tantalum pentoxide, niobium pentoxide, and zirconium dioxide. Such an intervening layer provides a composite substrate with high bonding strength.

Here, the acoustic velocity of the transverse wave in the second intervening layer is slower than the acoustic velocity of the fast transverse wave in the piezoelectric single crystal thin film, which allows for better suppression of spurious at frequencies higher than the main mode frequency. In other words, at frequencies higher than the main mode frequency, the bulk wave is radiated into the piezoelectric single crystal thin film at an angle even deeper than 22°. In this case, there will be the bulk wave that leaks into the first intervening layer. The bulk waves can easily enter the second intervening layer due to the acoustic velocity of the transverse wave in the second intervening layer being slower than the acoustic velocity of the fast transverse wave in the piezoelectric single crystal thin film. However, the bulk wave that is re-reflected in the supporting substrate is re-reflected at the first intervening layer and cannot be easily returned to the first intervening layer. As a result, the bulk wave is confined in the second intervening layer and is difficult to return to the piezoelectric single crystal thin film. Thus ripples at frequencies within or higher than the passband of the filter can be prevented.

In the present invention, any bonding interface between the piezoelectric single crystal thin film and the support substrate (e.g., the bonding interface between the first intervening layer and the layer adjacent to the first intervening layer) may have an uneven structure. The ratio of the average length RSm of the elements in the cross-sectional curve of the uneven structure to the wavelength λ of the surface acoustic wave when used as a surface acoustic wave device may be between 0.2 and 5.0.

When the piezoelectric single crystal thin film of the present application has an uneven structure at the boundary with the intervening layer, the bulk wave in the direction of approximately 22° due to the main mode from the LT is scattered by the uneven structure and the component returning to the electrode can be drastically reduced. If the frequency of the main mode is fo and the radiation angle of the bulk wave from the electrode of the SAW device to the inside of the LT is θ, a reflected wave is generated at a frequency higher than fo, where the frequency is represented by fo/cos θ, but the uneven structure can scatter the reflected wave.

In addition, the inventors studied the degree of the aforementioned unevenness and found that if the ratio of the average length RSm of the elements in the cross-sectional curve of the uneven structure to the wavelength λ of the surface acoustic wave when used as a surface acoustic wave device is between 0.2 and 5.0, the composite substrate for the surface acoustic wave device of the present application can maintain a single polarization without losing the polarization of the piezoelectric single crystal, thus completing the invention.

In the present invention, the piezoelectric material forming the piezoelectric single crystal thin film may be lithium tantalate or lithium niobate.

In the present invention, the support substrate may be any of a silicon wafer, a sapphire wafer, an alumina wafer, a glass wafer, a silicon carbide wafer, an aluminum nitride wafer, a silicon nitride wafer, and a crystallized quartz.

The method of manufacturing a composite substrate according to an embodiment of the present invention is characterized by a step of depositing a diffusion prevention layer on one side of a substrate of piezoelectric material, a step of further depositing an intervening layer on the diffusion prevention layer, a step of bonding a support substrate on the diffusion prevention layer, and a step of thinning the other side of the substrate of piezoelectric material. The method for manufacturing the composite substrate is characterized by heat treatment of the composite substrate under a reducing or inert gas atmosphere containing nitrogen or hydrogen.

In the present invention, it is preferable that the diffusion prevention layer is deposited by PVD or CVD methods.

In the present invention, the bonding surface of the diffusion prevention layer and/or the bonding surface of the support substrate may be applied with surface activation treatment and then bonded to each other. The surface activation treatment may include any one of a plasma activation method, an ion beam activation method, and an ozone water activation method.

DETAILED DESCRIPTION OF THE EMBODIMENTS

Figure 1:
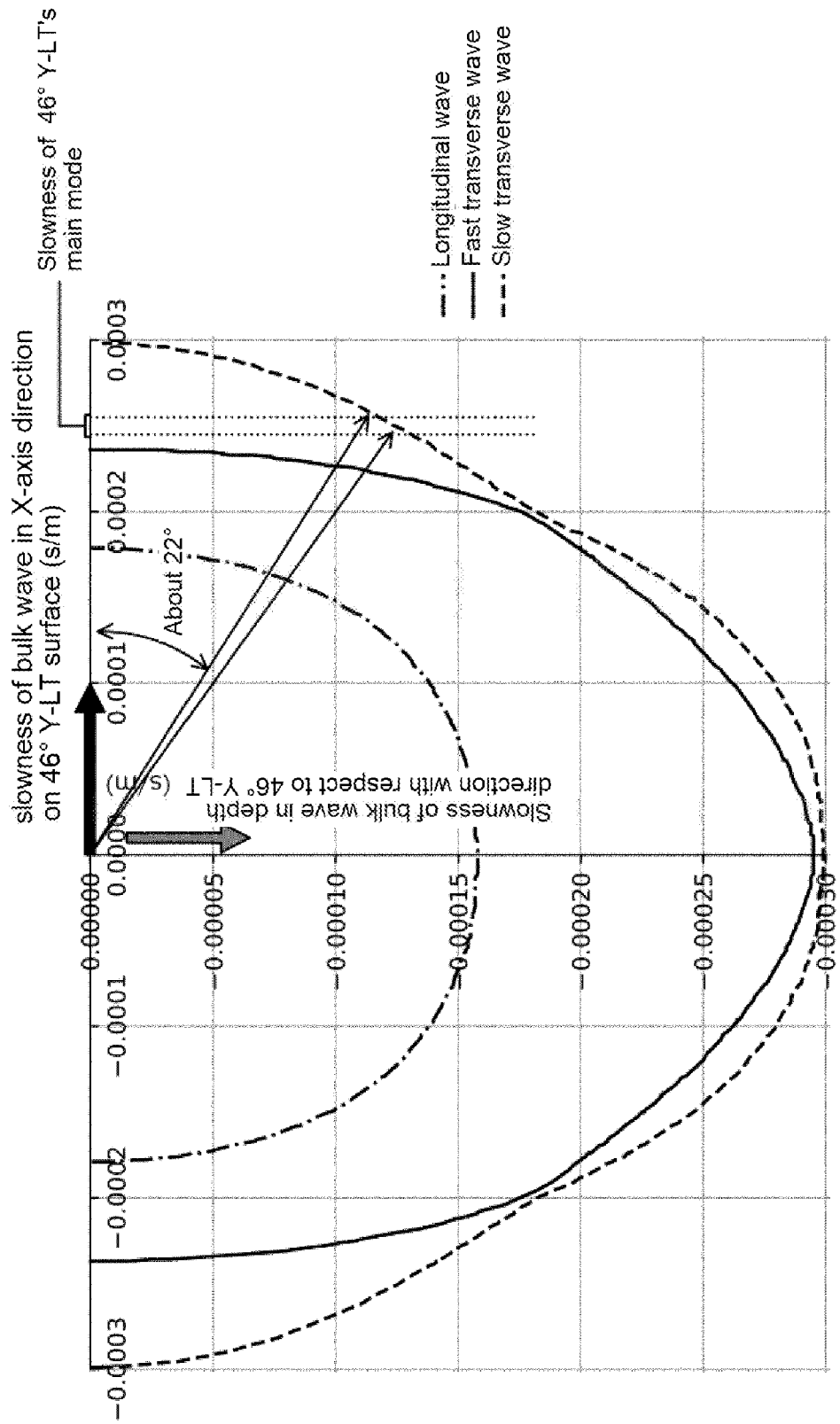
FIG. 1 shows the slowness surface of the 46° rotated Y-cut LT.
Figure 2:
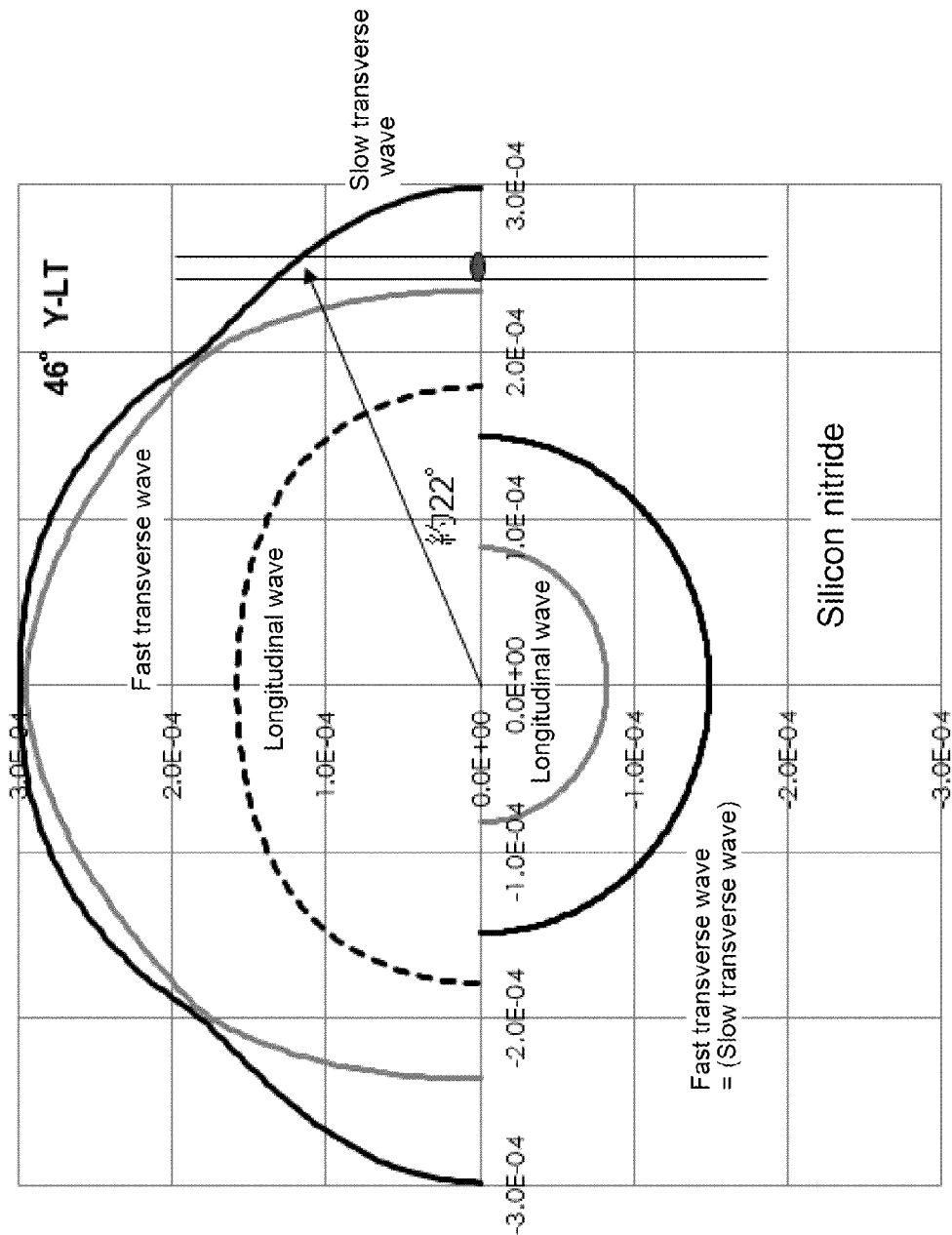
FIG. 2 shows a slowness representation of the 46° rotated Y-cut LT and intervening layer ($Si_3N_4$) in the YX plane.
Figure 3:
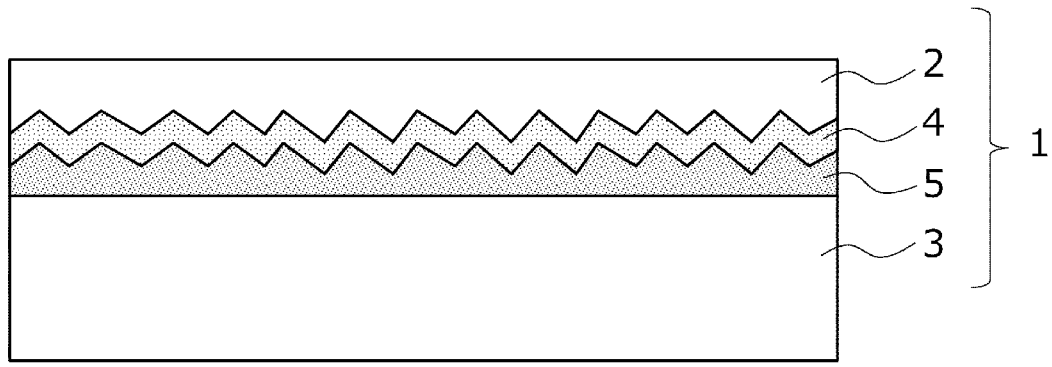
FIG. 3 shows a cross-sectional view of the cross-sectional structure of the composite substrate.

The cross-sectional structure of a composite substrate 1 according to the present invention is shown in FIG. 3. The composite substrate 1 shown in FIG. 3 has a piezoelectric single crystal thin film 2 on a support substrate 3. The piezoelectric single crystal thin film 2 has high acoustic velocity. The piezoelectric single crystal thin film 2 is bonded to the support substrate 3 via a diffusion prevention layer 4 that prevents oxygen diffusion and an intervening layer 5.

The piezoelectric single crystal thin film 2 is formed by lithium tantalate (LT) or lithium niobate (LN), which are piezoelectric materials. The piezoelectric single crystal thin film 2 preferably has a single polarization. The support substrate 3 may be any of a silicon wafer, a sapphire wafer, an alumina wafer, a glass wafer, a silicon carbide wafer, an aluminum nitride wafer, a silicon nitride wafer, and a crystallized quartz wafer.

The diffusion prevention layer 4 is sometimes referred to as the first intervening layer in the present invention. The diffusion prevention layer 4 is placed in contact with the piezoelectric single crystal thin film 2. The diffusion prevention layer 4 is formed so that the acoustic velocity of the transverse wave in the diffusion prevention layer 4 is faster than the acoustic velocity of the fast transverse wave in the piezoelectric single crystal thin film 2. The diffusion prevention layer 4 has a water vapor transmission rate of $10^{-3}$ ($g/m^2$/day) or less. The diffusion prevention layer 4 may be formed by any of silicon oxynitride, silicon nitride, amorphous aluminum nitride, or aluminum oxide.

The intervening layer 5 is provided between the diffusion prevention layer 4 and the support substrate 3. The intervening layer 5 is sometimes referred to as the first intervening layer or, to distinguish it from the diffusion prevention layer 4, referred to as the second intervening layer. The intervening layer 5 may be formed by materials containing oxygen. More specifically, the intervening layer may contain any of the following: silicon dioxide, titanium dioxide, tantalum pentoxide, niobium pentoxide, and zirconium dioxide. The intervening layer 5 is formed so that the acoustic velocity of the transverse wave in the intervening layer 5 is slower than the acoustic velocity of the fast transverse wave in the piezoelectric single crystal thin film 2.

An uneven structure is formed at the bonding interface between the diffusion prevention layer 4 and the layer adjacent to the diffusion prevention layer 4 (in this example, at the interface with the piezoelectric single crystal thin film 2 or at the interface with the intervening layer 5). The uneven structure is formed so that the ratio of the average length RSm of the element in the sectional curve of the uneven structure and the wavelength λ of the surface acoustic wave when used as a surface acoustic wave device, is 0.2 or more and 5.0 or less.

Figure 4:
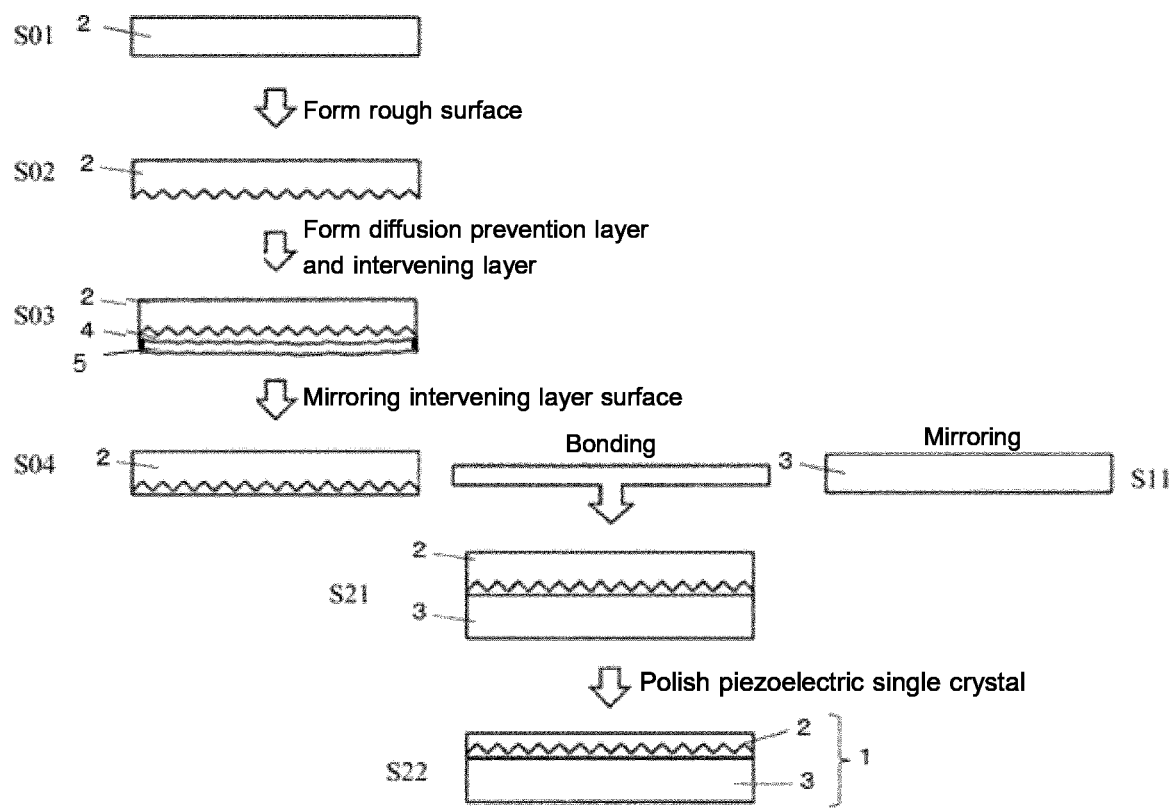
FIG. 4 shows the procedure for manufacturing the composite substrate.

FIG. 4 shows the procedure of method for manufacturing the composite substrate 1. In this manufacturing method, a piezoelectric single crystal wafer 2, which is a piezoelectric single crystal thin film, is first prepared (S01 in FIG. 4), and the uneven structure is formed on one of its surfaces by polishing with loose abrasive grains or sandblasting (S02 in FIG. 4). In addition, a diffusion prevention layer 4 is formed over the aforementioned uneven structure of the piezoelectric single crystal thin film, followed by the formation of an intervening layer 5 on this diffusion prevention layer 4 (S03 in FIG. 4). At this time, it is preferable that the diffusion prevention layer 4 is deposited by PVD or CVD methods. It is preferable that the intervening layer 5 is also deposited by PVD or CVD methods. The surface of the intervening layer is then mirrored by polishing (S04 in FIG. 4).

In parallel with the processing of piezoelectric single crystal wafers described above, a support substrate 3 is prepared (S11 in FIG. 4). As the support substrate 3, any of a silicon wafer, a sapphire wafer, an alumina wafer, a glass wafer, a silicon carbide wafer, an aluminum nitride wafer, a silicon nitride wafer, and a crystallized quartz wafer may be used. The surface of the support substrate is mirrored by polishing. Instead of or in addition to the piezoelectric single crystal thin film 2, the support substrate 3 may also be provided with an uneven structure or intervening layers. In this case, the uneven structure on the support substrate 3 may be formed by polishing with free abrasive grains, sandblasting, chemical etching, etc., and then an intervening layer may be formed over this uneven structure. Then the intervening layer may be mirrored by polishing to make a bonding surface.

The polished surface of the intervening layer 5 and the bonding surface of the support substrate 3 are bonded together (S21 in FIG. 4). After that, the other side (i.e., the side opposite to the side where the diffusion prevention layer 4 is formed) in the piezoelectric single crystal wafer 2 is ground and polished to thin it to the desired thickness. Thereby the composite substrate for surface acoustic wave device can be made (S22 in FIG. 4). At this time, the surface to be bonded may be applied with surface activated treatment in advance. In this way, the bonding strength can be increased. A plasma activation method, an ion beam activation method, and an ozone water activation method can be used for surface activation treatment. In the plasma activation method, plasma gas is introduced into the reaction vessel in which the wafers are placed, and high-frequency plasma of about 100 W is formed under a reduced pressure of about 0.01-0.1 Pa, exposing the wafer bonding surface to the plasma for about 5-50 seconds. As the gas for plasma, oxygen, hydrogen, nitrogen, argon, or a mixture of these gases can be used.

After thinning, it is preferable to perform heat treatment under a reducing or inert gas atmosphere containing nitrogen or hydrogen to further increase the bonding strength. As for the reducing atmosphere, for example, a hydrogen atmosphere can be used. As for the inert gas atmosphere, for example, nitrogen atmosphere can be used.

EXAMPLES

Example 1

Approximately 800 nm of silicon nitride was deposited on one side of a 46° rotated Y-cut LT wafer with a diameter of 150 mm by the PVD method to form a diffusion prevention layer. Then, a silicon oxide film was formed on this diffusion prevention layer by CVD to a thickness of about 3 μm. The silicon oxide film was polished and bonded to a p-type silicon wafer with a resistivity of 2000 Ω·cm using this silicon oxide film as an intervening layer. The LT wafers used had a volume resistivity of about $1 \times 10^{10}$ Ω·cm.

The surface on which the silicon nitride layer was formed of the LT wafer was finished by sandblasting into an uneven structure with an average length of the elements in the cross-sectional curve of RSm of 3 μm and Ra=0.06 μm.

After the bonding, heat treatment was applied in a nitrogen atmosphere at 100° C. for 48 hours. The LT layer was then thinned by grinding and polishing to a thickness of 10 μm. Then, to further increase the bonding strength, heat treatment was performed at 250° C. for 24 hours in a hydrogen atmosphere.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $5 \times 10^{10}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

Figure 5:
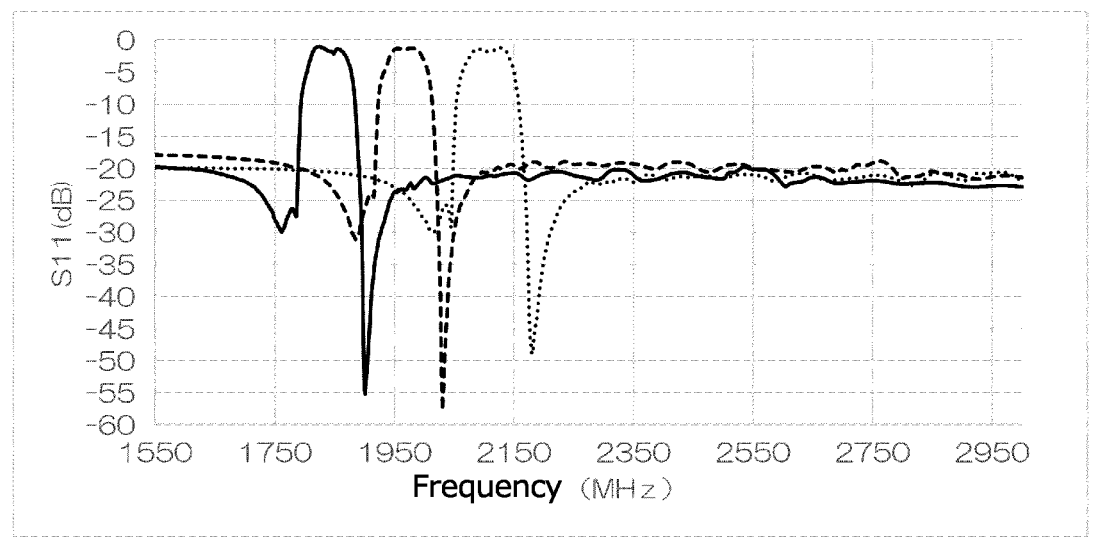
FIG. 5 shows a waveform representing the characteristics (S11 frequency response) of the SAW filter formed on the composite piezoelectric substrate in Example 1.

The characteristics of the SAW filters were evaluated by RF probe and network analyzer, and a suitable waveform (frequency response of S11) was obtained as shown in FIG. 5. The SAW filters with wavelengths of about 2.2 μm, 2.1 μm, and 1.9 μm were placed in the same wafer. Therefore, in this example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the results were the same as in FIG. 5.

Figure 6:
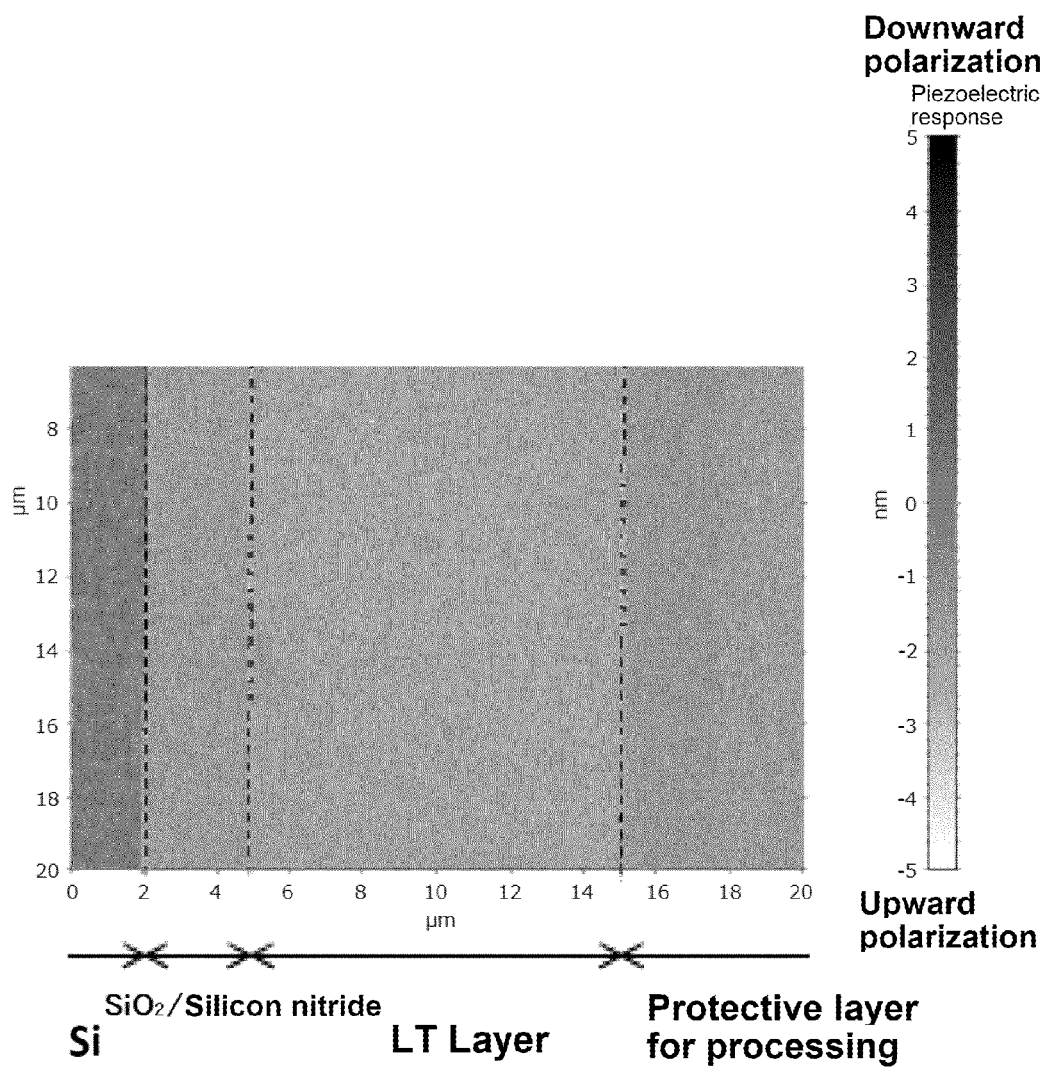
FIG. 6 shows a piezoresponse force microscopy (PFM) image of the cross-section of the composite substrate of Example 1.

Next, the piezoresponse force microscopy (PFM) image of the cross-section of the composite substrate manufactured in the same manner as described above was measured. As a result, the LT portion was found to be uniformly polarized, as shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, the LT portion was found to be uniformly polarized, similar to the one shown in FIG. 6.

In Example 1 described above, Young's modulus and density of silicon nitride and $SiO_2$, which are the intervening layer, were measured by nanoindentation and X-ray reflectivity (Xrr) methods, respectively. Table 1 shows the calculated acoustic velocity of the transverse waves of the silicon nitride film and the $SiO_2$ film obtained from the results of Example 1 and Young's modulus and density described above.

TABLE 1

|  | Silicon nitride | $SiO_2$ | $SiO_{1.5}N_{0.5}$ |
| --- | --- | --- | --- |
| Young's modulus (Gpa) | 320 | 62 | 130 |
| Density (kg/m$^3$) | 2,800 | 2,180 | 2,260 |
| Acoustic velocity of transverse wave (m/s) | 6,700 | 3,700 | 4,865 |

The acoustic velocity of the fast transverse wave in the x-axis direction of 46°Y—LiTaO$_3$ is calculated to be 4227 m/s.

Example 2

The composite substrate was manufactured in the same manner as in Example 1, except that the heat treatment to further increase the bonding strength after thinning the LT layer was conducted in a nitrogen atmosphere instead of a hydrogen atmosphere. For this composite substrate, the apparent volume resistivity of the composite substrate was measured by the method described in "JIS C 2139: 2008 Solid electrical insulating materials—Measurement method of volume resistivity and surface resistivity", and the volume resistivity was $2\times10^{11}$ Ω·cm. The applied voltage when measuring the volume resistivity was 500 V.

Next, in the same manner as Example 1, ladder-type SAW filters were formed on the composite substrate manufactured by the above method, and a 50 nm silicon nitride layer was formed by sputtering on the surface layer of the substrate where the SAW filters were formed.

When the characteristics of the SAW filters were evaluated using an RF probe and network analyzer, a waveform similar to the one in FIG. 5 was obtained. The SAW filters with wavelengths of about 2.2 μm, 2.1 μm, and 1.9 μm were placed in the same wafer. Therefore, in this example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the results were the same as in FIG. 5.

Furthermore, the PFM image of the cross-section of the composite substrate manufactured in the same way as described above was measured. As a result, the LT portion was found to be uniformly polarized, similar to the one shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, the LT portion was found to be uniformly polarized, similar to the one shown in FIG. 6.

Example 3

Approximately 800 nm of $SiO_{1.5}N_{0.5}$ was deposited on one side of a 46° rotated Y-cut LT wafer with a diameter of 150 mm by the CVD method at a temperature of about 35° C. to form a diffusion prevention layer. Then, a silicon oxide film was formed on this diffusion prevention layer by CVD to a thickness of about 3 μm. The silicon oxide film was polished and bonded to a p-type silicon wafer with a resistivity of 2000 Ω·cm using this silicon oxide film as an intervening layer. The LT wafers used had a volume resistivity of about $5\times10^{10}$ Ω·cm.

The surface on which the $SiO_{1.5}N_{0.5}$ layer was formed of the LT wafer was finished by sandblasting into an uneven structure with an average length of the elements in the cross-sectional curve of RSm of 3 μm and Ra=0.06 μm.

After the bonding, heat treatment was applied in a nitrogen atmosphere at 100° C. for 48 hours. The LT layer was then thinned by grinding and polishing to a thickness of 10 μm. Then, to further increase the bonding strength, heat treatment was performed at 250° C. for 24 hours in a hydrogen atmosphere.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $7\times10^{10}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

When the characteristics of the SAW filters were evaluated using an RF probe and network analyzer, a waveform similar to the one in FIG. 5 was obtained.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and there was no change from FIG. 5.

Furthermore, the PFM image of the cross-section of the composite substrate manufactured in the same way as described above was measured. As a result, the LT portion was found to be uniformly polarized, similar to the one shown in FIG. 6. The PFM image of the cross-section of the composite substrate with SAW filter pattern was measured after passing the substrate through the reflow oven at 265° C. six times and then heat cycling it from −40° C. to 125° C. for 1000 cycles. As a result, the LT portion was found to be uniformly polarized, similar to the one shown in FIG. 6.

Example 4

The composite substrate was manufactured in the same manner as in Example 3, except that the heat treatment to further increase the bonding strength after thinning the LT layer was conducted in a nitrogen atmosphere instead of a hydrogen atmosphere. For this composite substrate, the apparent volume resistivity of the composite substrate was measured by the method described in "JIS C 2139: 2008 Solid electrical insulating materials—Measurement method of volume resistivity and surface resistivity", and the volume resistivity was $4×10^{11}$ Ω·cm. The applied voltage when measuring the volume resistivity was 500 V.

Next, in the same manner as Example 3, ladder-type SAW filters were formed on the composite substrate manufactured by the above method, and a 50 nm silicon nitride layer was formed by sputtering on the surface layer of the substrate where the SAW filters were formed.

When the characteristics of the SAW filters were evaluated using an RF probe and network analyzer, a waveform similar to the one in FIG. 5 was obtained. The SAW filters with wavelengths of about 2.2 μm, 2.1 μm, and 1.9 μm were placed in the same wafer. Therefore, in this example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the results were the same as in FIG. 5.

Furthermore, the PFM image of the cross-section of the composite substrate manufactured in the same way as described above was measured. As a result, the LT portion was found to be uniformly polarized, similar to the one shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, the LT portion was found to be uniformly polarized, similar to the one shown in FIG. 6.

Examples 5 and 6

A composite substrate manufactured in the same manner as in Example 1, except that about 800 nm of the diffusion prevention layer shown in Table 2 was deposited on one side of a 46° rotated Y-cut LT wafer with a diameter of 150 mm by the PVD or PLD, was prepared. For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was values shown in Table 2. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

When the characteristics of the SAW filters were evaluated using an RF probe and network analyzer, a waveform similar to the one in FIG. 5 was obtained. The SAW filters with wavelengths of about 2.2 μm, 2.1 μm, and 1.9 μm were placed in the same wafer. Therefore, in this example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the results were the same as in FIG. 5.

Furthermore, the PFM image of the cross-section of the composite substrate manufactured in the same way as described above was measured. As a result, the LT portion was found to be uniformly polarized, similar to the one shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, the LT portion was found to be uniformly polarized, similar to the one shown in FIG. 6.

In Examples 5 and 6 described above, Young's modulus and density of the intervening layer were measured by nanoindentation and X-ray reflectivity (Xrr) methods, respectively. Table 2 shows Young's modulus and density of the Examples 5 and 6 described above, and the calculated acoustic velocity of the transverse wave of the diffusion prevention layer obtained from the Young's modulus and the density

TABLE 2

|  | Diffusion prevention layer | Volume resistivity of composite substrate (Ω · cm) | Young's modulus (Gpa) | Density (kg/m³) | Acoustic velocity of transverse wave (m/s) |
|---|---|---|---|---|---|
| Example 5 | Amorphous Aluminum Nitride | $5 × 10^{10}$ | 350 | 3,260 | 5,750 |
| Example 6 | Aluminum Oxide | $8 × 10^{10}$ | 400 | 3,980 | 6,390 |

Comparative Example 1

Then, a silicon oxide film was formed on one side of a 46° rotated Y-cut LT wafer with a diameter of 150 mm by CVD to a thickness of about 4 μm. The silicon oxide film was polished and bonded to a p-type silicon wafer with a resistivity of 2000 Ω·cm using this silicon oxide film as an intervening layer. The LT wafers used had a volume resistivity of about $5×10^{10}$ Ω·cm.

The surface on which the silicon nitride layer was formed of the LT wafer was finished by sandblasting into an uneven structure with an average length of the elements in the cross-sectional curve of RSm of 3 μm and Ra=0.06 μm.

After the bonding, heat treatment was applied in a nitrogen atmosphere at 100° C. for 48 hours. The LT layer was then thinned by grinding and polishing to a thickness of 10 μm. Then, to further increase the bonding strength, heat treatment was performed at 250° C. for 24 hours in a nitrogen atmosphere.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $2\times10^{12}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

Figure 7:
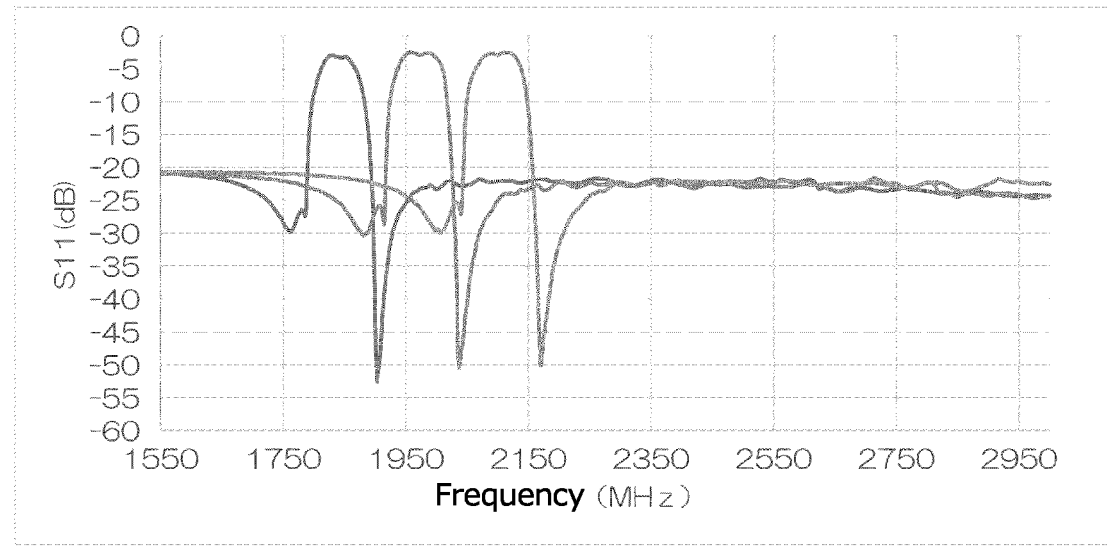
FIG. 7 shows a waveform representing the characteristics (S11 frequency response) of the SAW filter formed on the composite piezoelectric substrate in Comparative Example 1 before heat cycling.

The characteristics of the SAW filters were evaluated by RF probe and network analyzer, and a waveform as shown in FIG. 7 was obtained. The SAW filters with wavelengths of about 2.2 μm, 2.1 μm, and 1.9 μm were placed in the same wafer. Therefore, in this comparative example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the insertion loss increased by about 5 dB compared to the waveform in FIG. 7.

Furthermore, the PFM image of the cross-section of the composite substrate manufactured in the same way as described above was measured. As a result, the LT portion was found to be uniformly polarized, similar to the one shown in FIG. 6.

Figure 8:
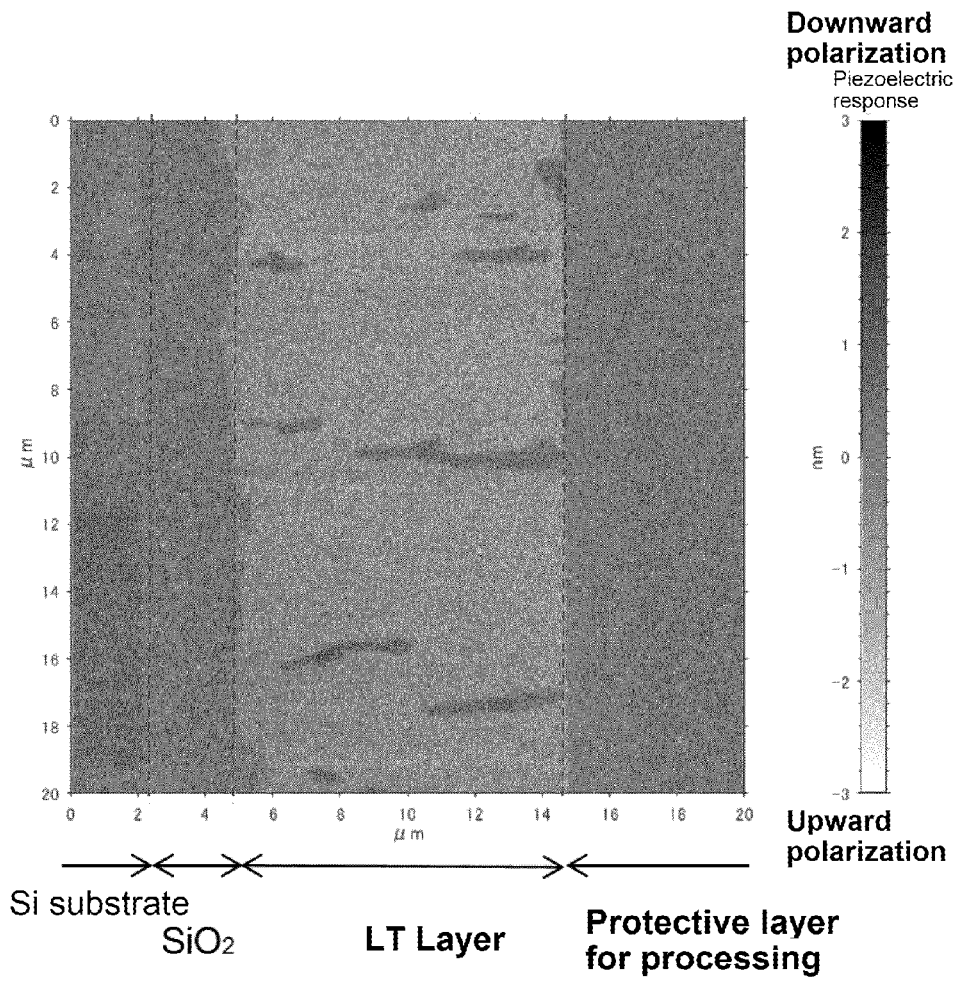
FIG. 8 shows a piezoresponse force microscopy (PFM) image of the cross-section of the composite substrate of Comparative Example 2 after heat cycling.

The PFM image of the cross-section of the composite substrate with SAW filter pattern was measured after passing the substrate through the reflow oven at 265° C. six times and then heat cycling it from −40° C. to 125° C. for 1000 cycles. As a result, as shown in FIG. 8, the polarization of the LT portion was disordered.

In Comparative Example 1 described above, Young's modulus and density of $SiO_2$, which is the intervening layer, were measured by nanoindentation and X-ray reflectivity (Xrr) methods, respectively. The results of Comparative Example 1 described above and the acoustic velocity of transverse wave (calculated value) of $SiO_2$ film obtained from Young's modulus and density were equivalent to the values shown in Table 1.

Comparative Example 2

The composite substrate was prepared in the same manner as in Comparative Example 1, except that the LT layer was thinned by grinding and polishing to a thickness of 10 μm, and that the composite substrate was heat-treated at 250° C. for 24 hours in an atmospheric atmosphere to further increase the bonding strength.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $1\times10^{14}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

When the characteristics of the SAW filters were evaluated using an RF probe and network analyzer, a waveform similar to the one in FIG. 7 was obtained. The SAW filters with wavelengths of about 2.2 μm, 2.1 μm, and 1.9 μm were placed in the same wafer. Therefore, in this comparative example, if the wavelength λ is taken as the average length of the elements in the cross-sectional curve of the uneven structure of the LT bonding surface, RSm/λ was 1.6, 1.5, and 1.4, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the insertion loss increased by about 6 dB compared to the waveform that was the same as in FIG. 7.

Furthermore, the PFM image of the cross-section of the composite substrate manufactured in the same way as described above was measured. As a result, the LT portion was found to be uniformly polarized, similar to the one shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, similar to that shown in FIG. 8, the polarization of the LT portion was disordered.

Comparative Example 3

Then, a silicon oxide film was formed on one side of a 46° rotated Y-cut LT wafer with a diameter of 150 mm by CVD to a thickness of about 4 μm. The silicon oxide film was polished and bonded to a p-type silicon wafer with a resistivity of 2000 Ω·cm using this silicon oxide film as an intervening layer. The LT wafers used had a volume resistivity of about $1\times10^{10}$ Ω·cm.

The surface on which the silicon oxide layer was formed of the LT wafer was finished by Loose abrasive grains into an uneven structure with an average length of the elements in the cross-sectional curve of RSm of 12 μm and Ra=0.3 μm.

After the bonding, heat treatment was applied in a nitrogen atmosphere at 100° C. for 48 hours. The LT layer was then thinned by grinding and polishing to a thickness of 10 μm. Then, to further increase the bonding strength, heat treatment was performed at 250° C. for 24 hours in a nitrogen atmosphere.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $8 \times 10^{12}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

When the characteristics of the SAW filters were evaluated using an RF probe and network analyzer, a waveform similar to the one in FIG. 7 was obtained. The SAW filters with wavelengths of about 2.2 μm, 2.1 μm, and 1.9 μm were placed in the same wafer. Therefore, in this comparative example, if the wavelength λ is taken as the average length of the elements in the cross-sectional curve of the uneven structure of the LT bonding surface, RSm/λ was 5.4, 5.7, and 6.3, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the insertion loss increased by about 8 dB compared to the waveform that was the same as in FIG. 7.

Furthermore, the PFM image of the cross-section of the composite substrate manufactured in the same way as described above was measured. As a result, the LT portion was found to be uniformly polarized, similar to the one shown in FIG. 6.

Figure 9:
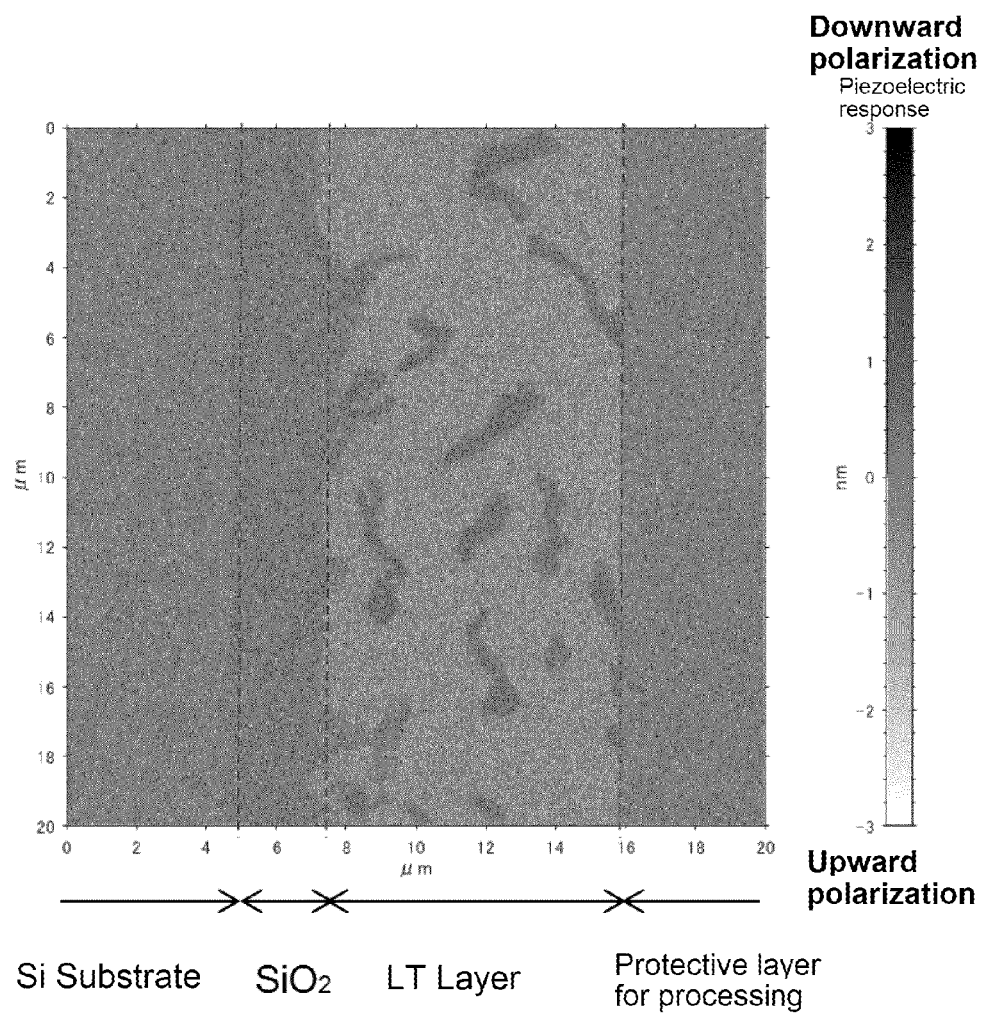
FIG. 9 shows a piezoresponse force microscopy (PFM) image of the cross-section of the composite substrate of Comparative Example 3 after heat cycling.

The PFM image of the cross-section of the composite substrate with SAW filter pattern was measured after passing the substrate through the reflow oven at 265° C. six times and then heat cycling it from −40° C. to 125° C. for 1000 cycles. As a result, as shown in FIG. 9, the polarization of the LT portion was disordered.

In Comparative Example 3 described above, Young's modulus and density of $SiO_2$, which is the intervening layer, were measured by nanoindentation and X-ray reflectivity (Xrr) methods, respectively. The results of Comparative Example 3 described above and the acoustic velocity of transverse wave (calculated value) of $SiO_2$ film obtained from Young's modulus and density were equivalent to the values shown in Table 1.

Comparative Example 4

The composite substrate was manufactured in the same manner as in Comparative Example 3, except that the heat treatment to further increase the bonding strength after thinning the LT layer was conducted in an air atmosphere instead of a nitrogen atmosphere.

For the composite substrate manufactured as described above, the apparent volume resistivity of the composite substrate was measured by the method described in "JIS C 2139: 2008 Solid electrical insulating materials—Measurement method of volume resistivity and surface resistivity", and the volume resistivity was $3 \times 10^{14}$ Ω·cm. The applied voltage when measuring the volume resistivity was 500 V.

Next, an Al film was sputtered onto the composite substrate manufactured as described above at a thickness of 0.14 μm, and a resist pattern with a line width of about 0.5 μm was formed by i-line exposure after applying resist. Then, Al was etched by dry etching to form ladder-type SAW filters. In addition, a silicon nitride layer of 50 nm was formed by sputtering on the surface layer of the substrate where the SAW filters were formed.

When the characteristics of the SAW filters were evaluated using an RF probe and network analyzer, a waveform similar to the one in FIG. 7 was obtained. The SAW filters with wavelengths of about 2.2 μm, 2.1 μm, and 1.9 μm were placed in the same wafer. Therefore, in this comparative example, if the wavelength λ is taken as the average length of the elements in the cross-sectional curve of the uneven structure of the LT bonding surface, RSm/λ was 5.4, 5.7, and 6.3, respectively, for the SAW filter at each wavelength.

Next, the composite substrate with SAW filter pattern made as described above was passed through a reflow oven at 265° C. six times, and then heat-cycled from −40° C. to 125° C. for 1000 cycles. After that, the characteristics of the SAW filters were again evaluated by RF probe and network analyzer, and the insertion loss increased by about 9 dB compared to the waveform that was the same as in FIG. 7.

Furthermore, the PFM image of the cross-section of the composite substrate manufactured in the same way as described above was measured. As a result, the LT portion was found to be uniformly polarized, similar to the one shown in FIG. 6.

The PFM image of the cross-section of the composite substrate with SAW filter pattern was measured after passing the substrate through the reflow oven at 265° C. six times and then heat cycling it from −40° C. to 125° C. for 1000 cycles. As a result, similar to that shown in FIG. 9, the polarization of the LT portion was disordered.

From the above Examples 1-6, it can be seen that the acoustic velocity of the transverse wave of the diffusion prevention layer is preferably faster than the acoustic velocity of the fast transverse wave of the piezoelectric single crystal thin film (LT). It is preferable that the acoustic velocity of the transverse wave of the intervening layer between the diffusion prevention layer and the support substrate is lower than the acoustic velocity of the fast transverse wave of the piezoelectric single crystal thin film. It is preferable that the ratio of the average length RSm of the element in the sectional curve of the uneven structure and the wavelength λ of the surface acoustic wave when used as a surface acoustic wave device is 0.2 or more and 5.0 or less.

What is claimed is:

1. A composite substrate for a surface acoustic wave device, comprising a piezoelectric single crystal thin film, a support substrate, and a first intervening layer between the piezoelectric single crystal thin film and the support substrate, wherein:
   the first intervening layer is in contact with the piezoelectric single crystal thin film; and
   an acoustic velocity of a transverse wave of the first intervening layer is faster than an acoustic velocity of a fast transverse wave of the piezoelectric single crystal thin film,
   wherein:
   a second intervening layer is provided between the first intervening layer and the support substrate; and
   an acoustic velocity of a transverse wave of the second intervening layer is slower than an acoustic velocity of a fast transverse wave of the piezoelectric single crystal thin film.

2. The composite substrate as claimed in claim 1, wherein the water vapor transmission rate of the first intervening layer is $10^{-3}$ (g/m²/day) or less.

3. The composite substrate as claimed in claim 1, wherein the first intervening layer is any of silicon oxynitride, silicon nitride, amorphous aluminum nitride, or aluminum oxide.

4. The composite substrate as claimed in claim 1, wherein the second intervening layer contains any of silicon dioxide, titanium dioxide, tantalum pentoxide, niobium pentoxide, and zirconium dioxide.

5. The composite substrate as claimed in claim 1, wherein the bonding interface between the first intervening layer and at least one layer adjacent to the first intervening layer has an uneven structure, and
the ratio of the average length RSm of the element in the sectional curve of the uneven structure and the wavelength λ of the surface acoustic wave when used as the surface acoustic wave device is 0.2 or more and 5.0 or less.

6. The composite substrate as claimed in claim 1, wherein the volume resistivity of the composite substrate is $1\times10^{12}$ Ω·cm or less.

7. The composite substrate as claimed in claim 1, wherein the piezoelectric single crystal thin film is formed by lithium tantalate or lithium niobate.

8. The composite substrate as claimed in claim 1, wherein the support substrate is any of a silicon wafer, a sapphire wafer, an alumina wafer, a glass wafer, a silicon carbide wafer, an aluminum nitride wafer, a silicon nitride wafer, and a crystallized quartz wafer.

9. The composite substrate as claimed in claim 1, wherein the piezoelectric single crystal thin film has a single polarization.

10. A composite substrate for a surface acoustic wave device, comprising a piezoelectric single crystal thin film, a support substrate, and a first intervening layer between the piezoelectric single crystal thin film and the support substrate, wherein:
the first intervening layer is in contact with the piezoelectric single crystal thin film; and
an acoustic velocity of a transverse wave of the first intervening layer is faster than an acoustic velocity of a fast transverse wave of the piezoelectric single crystal thin film,
wherein the bonding interface between the first intervening layer and at least one layer adjacent to the first intervening layer has an uneven structure, and
the ratio of the average length RSm of the element in the sectional curve of the uneven structure and the wavelength λ of the surface acoustic wave when used as the surface acoustic wave device is 0.2 or more and 5.0 or less.

11. The composite substrate as claimed in claim 10, wherein the water vapor transmission rate of the first intervening layer is $10^{-3}$ (g/m²/day) or less.

12. The composite substrate as claimed in claim 10, wherein the first intervening layer is any of silicon oxynitride, silicon nitride, amorphous aluminum nitride, or aluminum oxide.

13. The composite substrate as claimed in claim 10, wherein the volume resistivity of the composite substrate is $1\times10^{12}$ Ω·cm or less.

14. The composite substrate as claimed in claim 10, wherein the piezoelectric single crystal thin film is formed by lithium tantalate or lithium niobate.

15. The composite substrate as claimed in claim 10, wherein the support substrate is any of a silicon wafer, a sapphire wafer, an alumina wafer, a glass wafer, a silicon carbide wafer, an aluminum nitride wafer, a silicon nitride wafer, and a crystallized quartz wafer.

16. The composite substrate as claimed in claim 10, wherein the piezoelectric single crystal thin film has a single polarization.

* * * * *